(12) United States Patent
Nicholson et al.

(10) Patent No.: US 7,407,879 B2
(45) Date of Patent: Aug. 5, 2008

(54) CHEMICAL PLANARIZATION PERFORMANCE FOR COPPER/LOW-K INTERCONNECT STRUCTURES

(75) Inventors: Lee M Nicholson, Katonah, NY (US); Wei-Tsu Tseng, Hopewell Junction, NY (US); Christy S Tyberg, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 11/369,476

(22) Filed: Mar. 7, 2006

(65) Prior Publication Data
US 2006/0166012 A1    Jul. 27, 2006

Related U.S. Application Data

(62) Division of application No. 10/628,925, filed on Jul. 28, 2003, now Pat. No. 7,071,539.

(51) Int. Cl.
*H01L 21/4763* (2006.01)
(52) U.S. Cl. .................... 438/626; 438/624; 438/631; 438/645; 438/725
(58) Field of Classification Search ......... 438/622–624, 438/82, 725, 626, 631, 645; 257/E21.576, 257/E21.58, E21.583
See application file for complete search history.

(56) References Cited

U.S. PATENT DOCUMENTS

| | | | | |
|---|---|---|---|---|
| 5,789,819 | A | 8/1998 | Gnade et al. | 257/759 |
| 6,153,511 | A * | 11/2000 | Watatani | 438/623 |
| 6,177,199 | B1 | 1/2001 | Hacker et al. | 428/447 |
| 6,218,020 | B1 | 4/2001 | Hacker et al. | 428/447 |
| 6,265,780 | B1 | 7/2001 | Yew et al. | 257/759 |
| 6,383,920 | B1 | 5/2002 | Wang et al. | 438/639 |
| 6,660,627 | B2 * | 12/2003 | Hu et al. | 438/624 |
| 6,683,002 | B1 | 1/2004 | Chooi et al. | 438/687 |
| 6,975,033 | B2 * | 12/2005 | Ito et al. | 257/761 |
| 2001/0004550 | A1 | 6/2001 | Passemard | |

FOREIGN PATENT DOCUMENTS

| | | |
|---|---|---|
| WO | WO 00/31183 | 6/2000 |
| WO | WO 02/083327 | 10/2002 |

* cited by examiner

*Primary Examiner*—Hung Vu
(74) *Attorney, Agent, or Firm*—Ohlandt, Greeley, Ruggiero & Perle, L.L.P.; Daniel P. Morris, Esq.

(57) ABSTRACT

An electrical interconnect structure on a substrate, which includes: a first low-k dielectric layer; a spin-on low k CMP protective layer that is covalently bonded to the first low-k dielectric layer; and a CVD deposited hardmask/CMP polish stop layer is provided. Electrical vias and lines can be formed in the first low k dielectric layer. The spin-on low k CMP protective layer prevents damage to the low k dielectric which can be created due to non-uniformity in the CMP process from center to edge or in areas of varying metal density. The thickness of the low-k CMP protective layer can be adjusted to accommodate larger variations in the CMP process without significantly impacting the effective dielectric constant of the structure.

19 Claims, 4 Drawing Sheets

Processing steps up to CMP

Processing steps up to CMP eroded hardmask / protective layer intact / no dishing 1) Spin Dielectric layer or layers 2) Hot plate bake dielectric layer to crosslink (310°C, 2 min + 400°C, 2 min)

3) Spin CMP protective layer

4) Hot plate bake CMP protective layer (310°C, 2 min)

5) Furnace Cure multilayer stack (415°C, 1hr)

6) Deposit Hardmask / CMP polish stop layer by conventional CVD methods

*FIG. 4*

CHEMICAL PLANARIZATION PERFORMANCE FOR COPPER/LOW-K INTERCONNECT STRUCTURES

CROSS-REFERENCE TO RELATED APPLICATIONS

This application is a Divisional of and claims priority from U.S. patent application Ser. No. 10/628,925, filed Jul. 28, 2003 now U.S. Pat. No. 7,071,539.

BACKGROUND OF THE INVENTION

1. Field of the Invention

The present invention relates to interconnect structures for high-speed microprocessors, application specific integrated circuits (ASICs), and related high speed IC's. More particularly, the present invention provides low- or ultra low-dielectric constant (k) interconnect structures having enhanced circuit speed, precise values of conductor resistance, and improved mechanical integrity.

2. Description of the Prior Art

Many low-k dielectric plus Cu interconnect structures of the dual damascene type are known. For an example of the dual damascene process wherein SiLK™ has been used as a low-k dielectric material, reference is made to U.S. Pat. No. 6,383,920, assigned to the same assignee as the present invention, and is incorporated herein by reference in its entirety, as if fully set forth herein.

Integration with low and ultra-low dielectric constant (k) materials require a chemical mechanical planarization (CMP) polish stop layer in order to protect the underlying dielectric and prevent erosion and dishing of the low-k dielectric. Typically, chemical vapor deposition (CVD) materials with significantly higher dielectric constants (compared to the interlevel dielectric insulator materials) are applied directly to the line level dielectric materials forming a hardmask.

After CMP, a continuous layer of the CVD CMP polish stop layer must remain in the structure to prevent subsequent damage to the dielectric. In addition, the thickness must be sufficient that any non-uniformity in the CMP from center to edge or areas with varying metal fill will not lead to pin holes or areas where the CMP polish stop layer has been completely eroded. Therefore a higher dielectric constant material (typically SiC with k=4.1) must remain in the structure resulting in an increase in the effective dielectric constant.

SUMMARY OF THE INVENTION

It is an object of the present invention to provide an ultra low-k dielectric plus Cu interconnect structure of the single or dual damascene type with precise and uniform control over the Cu conductor resistance with decreased effective dielectric constant and improved reliability and ease of manufacture.

It is another object of the present invention to provide a low-k or porous ultra low-k dielectric stack with improved post CMP hardmask retention, improved reliability and reduced effective dielectric constant with minimal increase in the raw process time.

It is still another object of the present invention to provide a method to make the inventive structures described herein.

The present invention provides an electrical interconnect structure on a substrate. The interconnect structure includes:

a first low k or ultra low k dielectric layer;

a low k CMP protective layer disposed on the first low k dielectric layer; and a CVD hardmask/CMP polish stop layer.

The present invention provides a method of forming an electrical interconnect structure on a substrate. The method includes the steps of:

forming a low k CMP protective layer on a first low-k dielectric or an ultra low k dielectric layer disposed on a substrate; and forming a hardmask/CMP polish stop layer on the low k CMP protective layer such that the CMP protective layer covalently bonds with the first low-k dielectric or the ultra low k dielectric layer.

These and other objects, advantages and features of the present invention can be understood with reference to the detailed description and the annexed drawings that follow.

BRIEF DESCRIPTION OF THE DRAWINGS

FIG. 4 is a process flow chart of a method for making the structure of FIG. 2 or FIG. 3.

DETAILED DESCRIPTION OF THE INVENTION

Figure 1:
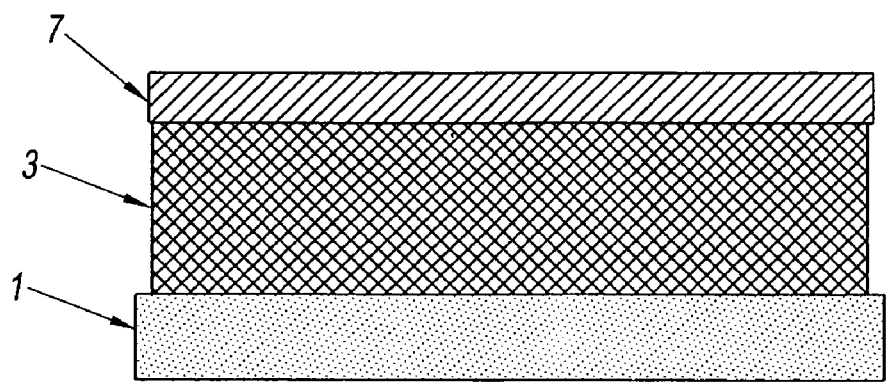
FIG. 1 is a schematic drawing illustrating the dielectric and the hardmask/CMP stop layer after deposition and then after subsequent processes up to and including CMP. This illustrates the possible effect of breaking through the hardmask/CMP polish stop layer due to non-uniformities in the CMP, center to edge or in areas of varying metal density.
Figure 1:
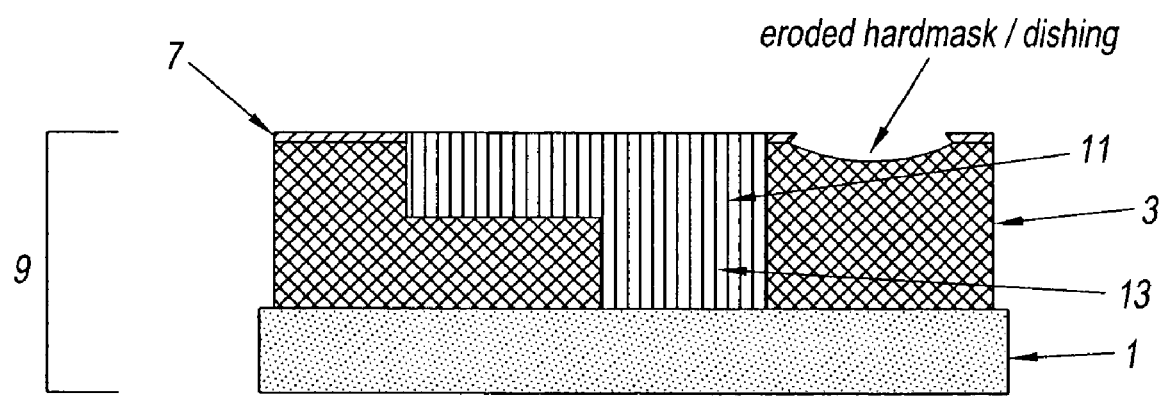

The present invention provides an electrical interconnect structure on a substrate, including a first low k or ultra low k dielectric layer; a low k CMP protective layer disposed on the first low k dielectric layer; and a CVD hardmask/CMP polish stop layer.

Preferably, the electrical interconnect structure includes a spin-on organic line level dielectric layer (or a dual damascene via and line level dielectric, with or without an embedded etch stop), a spin-on inorganic or inorganic-organic hybrid silsesquioxane CMP protective layer disposed on the spin-on organic line level dielectric layer, and a conventional plasma enhanced chemical vapor deposition (PECVD) hardmask/CMP polish stop layer.

Preferably, the first low k dielectric layer is comprised of a spin-on dielectric material, such as, SiLK™, which is a trademark of The Dow Chemical Company, representing a class of polymer-based low-k dielectric materials comprising a b-staged polymer (see, for example, http://www.dow.com/silk/feature.htm and the previously incorporated U.S. Pat. No. 6,383,920); GX-3 ™ (a trademark of Honeywell Electronic Materials, which is described in the web site http://www.electronicmaterials.com/na/products_services/thin_films/dielectrics/low_k_dielectrics.html); porous SiLK™ (a trademark of The Dow Chemical Company), GX-3p™ (a trademark of Honeywell Electronic Materials); JSR LKD 5109™ spin-on low k dielectric material containing Si, C, O, and H (a trademark of JSR Micro Corp.); porous spin-on $Si_wC_xO_yH_z$ material, spin-on dielectric material, low k spin-on dielectric material or porous low k spin-on dielectric material.

The line level dielectric layer can be comprised of SiLK™, GX-3™, porous SiLK™, GX-3p™ or other non-porous or porous organic low-k dielectric materials.

Materials of this kind are described in U.S. Pat. No. 5,965,679 entitled "Polyphenylene Oligomers and Polymers" of James P. Godschaix et al., assigned to The Dow Chemical Company, and in International Patent Application No. WO 00/31183 entitled "A Composition Containing a Cross-linkable Matrix Precursor and a Porogen, and a Porous Matrix Prepared Therefrom," of Kenneth J. Bruza et al., assigned to The Dow Chemical Company, the contents of which are incorporated herein by reference in their entirety, as if fully set forth herein.

Preferably, the spin-on low k CMP protective layer is covalently bonded to the first low k dielectric layer. Preferably, the spin-on low k CMP protective layer is comprised of a material with a low CMP polish rate that can be directly polished without scratching or producing other defects and has a dielectric constant of from about 2.2 to about 3.5.

Generally, the spin-on low k CMP protective layer is inert to chemicals contained in CMP polish slurries and has a low dielectric constant and low CMP polish rate. It has molecular level free volume or molecular level porosity having a volume percent from about 5% to about 80%. Preferably, the molecular level free volume has a size ranging from about 2 Å to about 50 Å.

The spin-on low k CMP protective layer mechanically behaves like a sponge, which provides damping capability under application of down force during polish. The spin-on low k CMP protective layer has fine and evenly dispersed pores or free volume and is comprised of a spin-on material, such as, HOSP™ (a trademark of Honeywell Electronic Materials), AP 6000™ (a trademark of Dow Chemical), HOSP BESt™ (a trademark of Honeywell Electronic Materials), Ensemble™ Etch Stop (a trademark of Dow Chemical), Ensemble™ Hard Mask (a trademark of Dow Chemical), organo silsesquioxane, hydrido silsesquioxane, hydrido-organo silsesquioxane copolymer, siloxane, silsesquioxane or other spin-on materials with a low dielectric constant (preferably less than 3.5 and more preferably less than 3.0), and a relatively low CMP polish rate in standard liner polish processes (preferably less than 350 Å/min, more preferably less than 150 Å/min.).

Materials of this kind are described in:

(1) U.S. Pat. No. 6,218,020 entitled "Dielectric Films from Organohydridosiloxane Resins with High Organic Content" of Nigel P. Hacker et al., assigned to Allied Signal Inc.;

(2) U.S. Pat. No. 6,177,199 entitled "Dielectric Films from Organohydridosiloxane Resins with Low Organic Content" of Nigel P. Hacker et al., assigned to AlliedSignal Inc.; and (3) International Application published under the Patent Cooperation Treaty (PCT) Publication Number WO 02/083327 A1 entitled "Layered Stacks and Methods of Production Thereof" of Michael Thomas et al., assigned to Honeywell International Inc.

The contents of these documents are incorporated herein by reference in their entirety as if fully set forth herein.

Typically, the CVD hardmask/CMP polish stop layer is a conventional CVD hardmask/CMP polish stop layer, which can be comprised of BLOk™ a barrier dielectric film (a trademark of Applied Materials, Inc.), silicon nitride, silicon carbide, $Si_xC_yN_z$ deposited material and CVD deposited material or other Si containing PECVD deposited material with a low CMP polish rate.

Materials of this kind are described in International Application published under the Patent Cooperation Treaty (PCT) Publication Number WO 00/19508 entitled "Silicon Carbide Deposition Method and use as a Barrier Layer and Passivation Layer" of Sudha Rathi et al., assigned to Applied Materials, Inc. The contents of this publication are incorporated herein by reference in their entirety as if fully set forth herein.

In one embodiment, the interconnect structure can include a plurality of patterned metal conductors formed within the dielectric layers on the substrate. At least one of the patterned metal conductors can be an electrical line and, in the case of a dual damascene structure, at least one of the patterned metal conductors can be a via.

The present invention also provides a method of forming an electrical interconnect structure on a substrate, including a single damascene or dual damascene thickness of a first dielectric (or multilayer dielectric stack including an embedded etch stop); forming a spin-on low-k CMP protective layer on the first dielectric layer; and curing the dielectric layer plus the low-k CMP protective layer. Thereafter, a traditional hardmask stack including at least a CMP polish stop layer can be deposited.

In a preferred embodiment, the dielectric layer can be comprised of SiLK™, GX-3™, porous SiLK™, GX-3p™ or other non-porous or porous spin-on low k dielectric materials and the spin-on low k CMP protective layer can be comprised of AP 6000 ™, HOSP™, HOSP BESt™, Ensemble™ Etch Stop, Ensemble™ Hard Mask, organo silsesquioxanes, hydrido silsesquioxanes, hydrido-organo silsesquioxanes copolymers, siloxanes, silsesquioxanes or other spin-on material with a low dielectric constant (preferably less than 3.5 and more preferably less than 3.0), and a relatively low CMP polish rate in standard liner polish processes (preferably less than 350 Å/min, more preferably less than 150 Å/min.).

In a preferred embodiment, the first low-k dielectric can be a porous organic dielectric and the spin-on low k CMP protective layer can be an inorganic material or an inorganic/organic hybrid material.

The first low k dielectric in the interconnect structure can be a stack of dielectric containing an embedded etch stop.

Preferably, the first low k dielectric layer has a thickness of from about 600 Å to about 8000 Å and the spin-on low k CMP protective layer has a thickness from about 50 Å to about 500 Å.

The structure employs a low-k CMP protective layer that is inert to the chemicals contained in CMP polish slurries. Mechanically, it behaves like a sponge, which provides damping capability under the application of down force during polish. The combination of this chemical inertness and the mechanical damping reduces the chemical attack and mechanical abrasion, respectively, during CMP, leading to the low polish rates. Such a damping mechanism also helps mitigate the local pressure variation across different pattern size, hence offers the additional advantage of reducing the pattern size/density dependence of polish rate.

This spongy or porous low-k CMP protective layer contains fine and evenly dispersed pores within the material due to the molecular level free volume of the material. Yet it still possesses high enough adhesion and shear strength to withstand the shear stress imposed by CMP. The spongy or porous structure of this material also gives rise to lower dielectric permittivity (low-k). As a consequence, the structure of the present invention has decreased effective dielectric constant over conventional low-k organic dielectric structures because the layer remaining after CMP has a significantly lower dielectric constant than conventional hardmask/CMP polish stop layers such as silicon carbide layers.

In addition, this layer can be chosen to have excellent adhesion to the dielectric material as a result of covalent bonding between the spin-on dielectric and the spin-on low-k CMP protective layer.

The structure of the present invention is unique in that it enables use of a CMP polish stop layer of higher k than the dielectric without significantly impacting the effective dielectric constant of the structure because it can be completely removed during polishing leaving only the low-k CMP protective layer.

Additionally, the thickness of the CMP protective layer or the CMP polish stop layer can be increased to account for non-uniformity in the CMP processes without affecting the effective dielectric constant of the structure. This allows for a more "manufacturable" CMP process window and improved yield and reliability by preventing damage to the dielectric during CMP.

In a preferred embodiment of the interconnect structure, the substrate can be a semiconductor wafer having an adhesion promoter layer formed thereon.

In a preferred embodiment of the interconnect structure, the structure can further include a stack of dielectric layers on the substrate. The stack can include at least the first low-k dielectric layer and the spin-on low k CMP protective layer and can further include a plurality of patterned metal conductors formed within the stack of the first low-k dielectric layer and the spin-on low k CMP protective layer.

At least one of the patterned metal conductors can be an electrical via and at least one of the patterned metal conductors can be a line connected to the via.

In another preferred embodiment of the interconnect structure, the structure can further include a single level of patterned metal conductors formed within the stack of dielectric layers on the substrate. Again, the patterned metal conductors can be a line or a via.

The present invention further provides a method of forming an electrical interconnect structure on a substrate, including:

forming a low k CMP protective layer on a first low-k dielectric or an ultra low k dielectric layer disposed on a substrate; and forming a hardmask/CMP polish stop layer on the low k CMP protective layer such that the CMP protective layer covalently bonds with the first low-k dielectric or the ultra low k dielectric layer.

The first low-k dielectric layer or ultra low k dielectric layer, the low k CMP protective layer, the hardmask/CMP polish stop layer and the substrate are as previously described herein above.

The method can further include forming a plurality of patterned metal conductors within the dielectric layer or layers on the substrate. Additional dielectric layers can be added and the structure can be completed by adding conductors.

In one embodiment, the method can further include the step of forming a metal line in the first dielectric layer or forming a metal via in the dielectric layer.

In another embodiment, the method can further include the steps of adding additional dielectric layers and adding conductors to complete the electrical interconnect structure.

In still another embodiment, the method can further include the steps of forming a stack of dielectric layers on the substrate, including at least the first dielectric layer and the low k CMP protective layer and forming a plurality of patterned metal conductors within the dielectric layers.

In yet another embodiment, the method can further include the steps of curing the dielectric layers to promote crosslinking of the CMP protective layer to the first low k dielectric layer and to reduce CMP polish rate of the CMP protective layer. In the case where the dielectric layers are in a stack, they can be cured after sequential application in a single tool, such as, a spin-coating tool containing high temperature hot plate baking chambers.

Preferably, the first dielectric and the CMP protective layers are cured in a single step in a furnace, typically at a temperature from about 300° C. to about 500° C. within a period of time from about 15 minutes to about 3 hours.

The method can further include curing the dielectric layer or layers and the CMP protective layer. The spin-on layers in the stack are preferably cured in a single step after sequential application in a single tool. The dielectric application tool can be a spin coating tool containing high temperature hot plate baking chambers, and the curing step can be a furnace curing step conducted at a temperature of from about 300° C. to about 500° C. for about 15 minutes to about 3 hours.

Structure in Accordance with the Present Invention

Referring to FIG. 1, a silicon substrate 1 has thereon a first low k dielectric layer 3, and a hardmask/CMP polish stop layer 7. Conventional hardmask/CMP polish stop layers are deposited after curing the dielectric by PECVD deposition techniques and have a dielectric constant equal to or greater than ~3.5. Increased thickness of this layer would allow a more controllable CMP process to prevent exposure of the CMP slurry to the dielectric, however this would negatively affect the overall effective dielectric constant.

Figure 2:
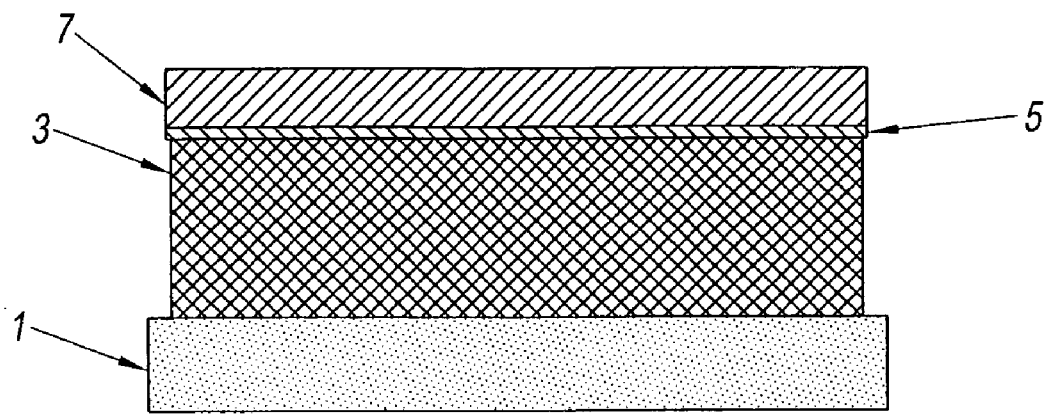
FIG. 2 is a schematic drawing illustrating the inventive structure including the dielectric, the spin-on low-k CMP protective layer, and the hardmask/CMP stop layer after deposition and then after subsequent processes up to and including CMP. This illustrates the possible effect of breaking through the hardmask/CMP polish stop layer due to non-uniformities in the CMP, center to edge or in areas of varying metal density.
Figure 2:
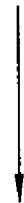
Figure 2:
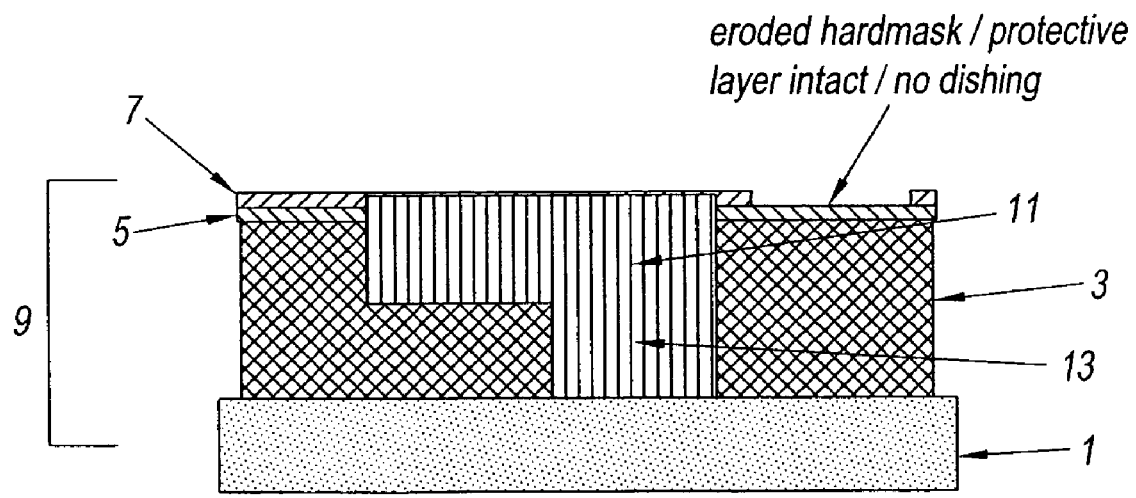
Figure 3:
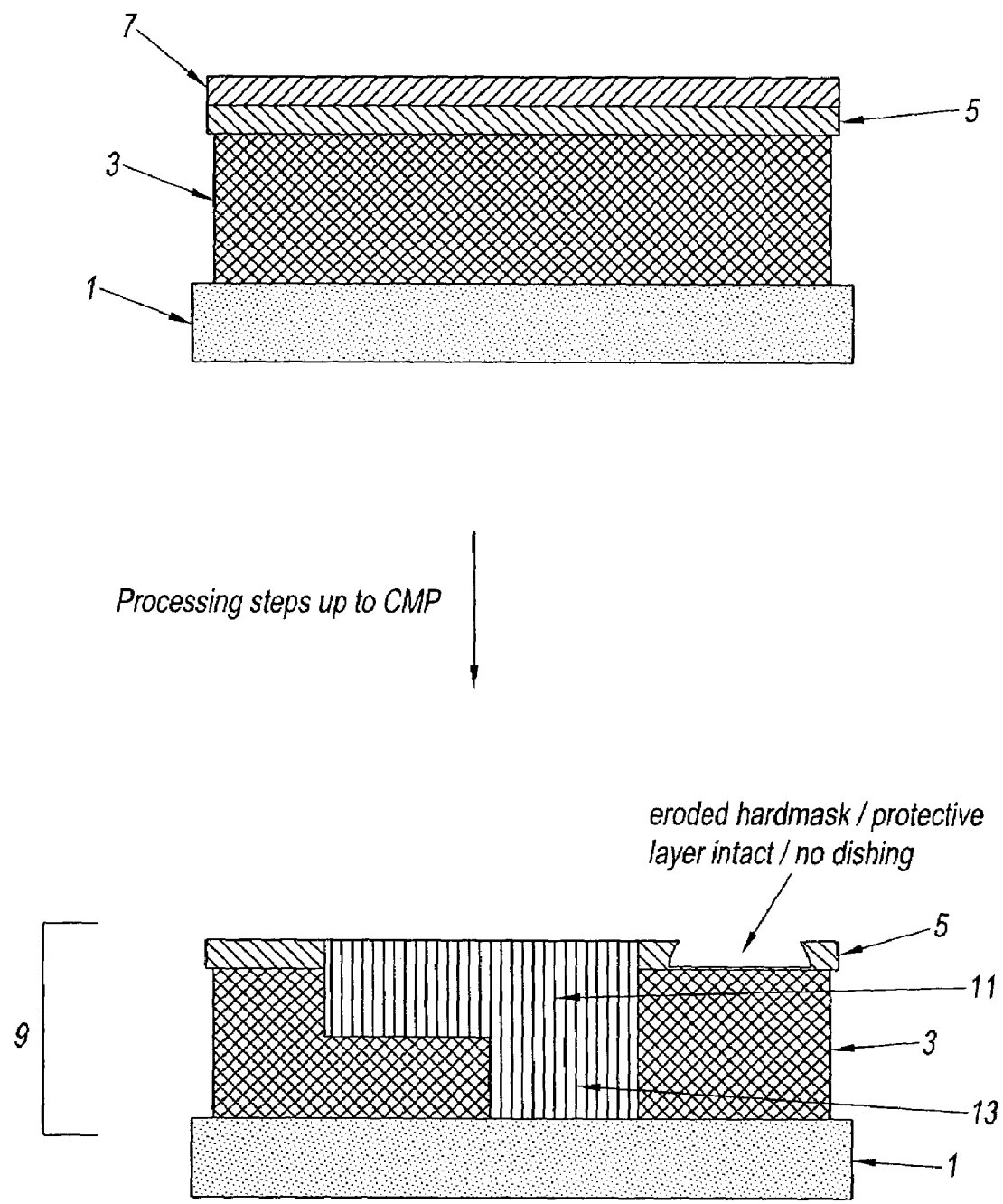
FIG. 3 is a schematic drawing illustrating the inventive structure including the dielectric, the spin-on low-k CMP protective layer, and the hardmask/CMP stop layer after deposition and then after subsequent processes up to and including CMP. In this structure a thicker CMP protective layer can be used so that all remaining material after CMP is low-k material. The thickness of the protective layer can be increased without impacting the effective dielectric constant.

Referring to FIG. 2 and FIG. 3, and as described in more detail below, improved reliability in combination with a lower overall effective dielectric constant is achieved by incorporating a spin-on low k CMP protective layer 5 between the hardmask/CMP polish stop layer and the dielectric. The thickness of the layer can be adjusted to prevent any exposure of the dielectric to the CMP slurry while allowing complete removal of the higher k hardmask/CMP polish stop layer. This prevents damage to the dielectric while maintaining a low effective dielectric constant.

Referring to FIGS. 2 and 3, substrate 1 can contain electronic devices such as, for example, transistors and an array of conductor elements. An interconnect structure 9, in accordance with the present invention is formed on substrate 1. Structure 9 is comprised of a SiLK™ dielectric layer 3, having a thickness of 600-8000 Å which can have a highly aromatic structure, that is thermally stable to approximately 425° C., with a glass transition temperature above 450° C., and a low dielectric constant of 2.65.

A HOSP™ CMP protective layer 5 of thickness 50-500 Å (more preferably 50-200 Å), and having the atomic composition that gives a CMP polish rate of less than ~200 Å/min, is disposed on the SiLK™ layer 3. This material has good adhesion to SiLK™ and thermal stability to a temperature of greater than 425° C., and a low dielectric constant of 3.2 or less.

A hardmask/CMP polish stop layer 7 SiC having a of thickness of 300-1000 Å, and being a silicon containing PECVD deposited material having a CMP polish rate less than ~300 Å/min and a dielectric constant of ~4.1, is disposed on the CMP protective layer 5.

Patterned metal lines 11 and vias 13, formed by a dual damascene process, are formed within the dielectric multilayer structure described above.

Other low-k spin coated materials can be used for the dielectric layer 3, and the CMP protective layer 5, and other PECVD deposited materials can be used for the hardmask/CMP polish stop layer 7. Examples of such materials that can be used for layer 3 are porous SiLK™, GX-3™, GX-3p™, JSR LKD 5109™, porous spin-on or CVD based $Si_wC_xO_yH_z$ or other low k or porous low k dielectric materials. Examples of other materials that could be used for layer 7 are AP 6000™, HOSP BESt™, Ensemble™ Etch Stop, Ensemble™ Hard Mask, organo silsesquioxanes, hydrido silsesquioxanes, hydrido-organo silsesquioxane copolymers, siloxanes, silsesquioxanes or other spin-on material low dielectric constant and low CMP polish rate.

A Method in Accordance with the Present Invention

A. Stack of Dielectric Layers

The interconnect structure 9 in accordance with the present invention can be applied to the substrate 1 or wafer by spin on techniques. The first layer 3 in the structure 3 is preferably a low k dielectric with a desired thickness of 600-8000 Å. This low k dielectric is applied by a spin-on technique with a spin speed of 1000-4000 rpm. After spinning, the substrate 1 is hot plate baked to remove the solvent of the low k dielectric at 100-350° C., for 30-120 seconds. The substrate 1 is then placed on an oxygen-controlled hot plate and cured at 350-400° C. for 1-7 minutes. This time and temperature is sufficient to render the film of the first layer 3 insoluble. After cooling, a spin-on CMP protective layer 5, with a desired thickness of 50-500 Å, is applied by a spin-on technique with a spin speed of 1000-4000 rpm. The wafer is then placed on an oxygen-controlled hot plate and baked at 150-350° C. for 30-120 seconds to dry the solvent.

B. Stack of Dielectric Layers Cured in a Single Cure Step

At this point the wafer is placed in a furnace in an atmosphere of pure $N_2$ (with very low $O_2$ and $H_2O$ concentrations), and cured at 350-450° C. for 1-3 hours to crosslink the dielectric and CMP protective layer. During this cure step, the CMP protective layer also chemically bonds to the surface of the dielectric resulting in excellent adhesion between the two layers. If the dielectric layer is a porous material the porogen is removed from the dielectric layer during the cure by thermally decomposing and diffusion through the free volume of the low k CMP protective layer.

C. Additional dielectric layers Added for Dual Damascene Patterning (Distributed Hard Mask)

As noted above, the dual damascene process described in, for example, U.S. Pat. No. 6,383,920 can be used when adding additional layers. Similar layers can be added for single damascene processing.

D. The Dual Damascene Structure of FIG. 3 Completed Using Standard Process Steps The dual damascene structure is completed by standard dual damascene BEOL processing which includes forming a trench and via in the dielectric, filling the trench with at least a conductive metal; planarizing the conductive metal stopping on the hard mask/CMP polish stop layer and in some areas of non-uniform CMP the planarizing will stop on the spin-on low k CMP protective layer. Single damascene processing can also be used.

EXAMPLE

A SiLK™/HOSP BESt™/BLOk™ Structure Produced

A. Stack of Dielectric Layers Formed as in FIG. 2

TABLE I

| Process Flow Chart | |
|---|---|
| Process | Conditions |
| Spin-coat | Adhesion Promoter |
| Hot Plate Bake | 310° C./90 seconds |
| Spin-coat | 1st ILD layer (SiLK) |

TABLE I-continued

| Process Flow Chart | |
|---|---|
| Process | Conditions |
| Hot Plate Bake | 310° C./2 min. |
| | 400° C./3 min. |
| Spin-coat | CMP protective layer (HOSP BESt) |
| Hot Plate Bake | 310° C./2 min |
| Cure | Furnace - 415° C./60 min. |
| CVD deposition | Silicon Carbide |

Referring to Table I above and FIG. 2, a 200 mm diameter silicon wafer substrate is treated with adhesion promoter by applying a solution of AP 6000™ to the wafer followed by spinning at 3000 rpm for 30 seconds. At 22, the wafer is then placed on a hot plate at 310° C. for 120 seconds for a first hot plate bake.

After cooling the wafer to room temperature, the first layer of low k dielectric (SiLK™) is applied (layer 3, FIG. 2). The SiLK™ solution is placed on the wafer and the wafer is spun at 3000 rpm for 30 seconds. After spinning, the wafer is placed on a 310° C. hot plate for 2 minute to partially dry the solvent. It is then transferred to a 400° C. hot plate for 3 minutes. The time and temperature schedule should be sufficient to render the film insoluble.

The wafer is then allowed to cool and is returned to the spinner. A solution of HOSP BESt™, diluted to achieve a film thickness of 100 Å at a spin speed of 2000 rpm, is applied to the wafer and spun at 2000 rpm for 30 seconds, to produce CMP protective layer 5 (FIG. 2). After spinning, the wafer is placed on a hot plate at 310° C. for 2 minutes to partially dry the solvent.

The wafer is placed in an oxygen controlled oven and cured at 415° C. for 60 minutes to cure the SiLK and CMP protective layers, promote crosslinking between the layers, and improve the mechanical properties of the CMP protective layer to reduce the CMP polish removal rate of the layer.

The cured wafer containing the layers described above is placed in a PECVD reactor and a 500 Å layer of Silicon Carbide is deposited. This completes the formation of the dielectric multilayer of the Example.

D. Dual Damascene Structure of FIG. 2 Completed

Deposition of additional patterning layers, lithography and etching processes are then performed as described in, for example, U.S. Pat. No. 6,383,920. The dual damascene structure is then completed using standard process methods known in the industry (the etched trench and via opening are filled with a liner and then with Cu, and the Cu is planarized by CMP).

During the final CMP process, most of the silicon carbide layer deposited is removed, leaving the structure shown in FIG. 2.

Alternatively all of the silicon carbide layer may be removed leaving the structure shown in FIG. 3.

While we have shown and described several embodiments in accordance with our invention, it is to be clearly understood that same are susceptible to numerous changes that would be apparent to one skilled in the art. Therefore, we do not wish to be limited to only what is shown or described but contemplate all changes and modifications that are within the scope of the appended claims.

What is claimed is:

1. A method of forming an electrical interconnect structure on a substrate, comprising:

forming a low k CMP protective layer on a first low-k dielectric or an ultra low k dielectric layer disposed on a substrate such that said CMP protective layer covalently bonds with said first low-k dielectric or said ultra low k dielectric layer; and forming a hardmask/CMP polish stop layer on said low k CMP protective layer.

2. The method of claim 1, wherein said first low-k dielectric layer is a first spin-on low k dielectric layer.

3. The method of claim 2, wherein said spin-on low k dielectric layer is selected from the group consisting of: SiLK™, GX-3™, porous SiLK™, GX-3p™, JSR LKD 5109™, porous spin-on $Si_wC_xO_yH_z$ material, spin-on dielectric material, low k spin-on dielectric material and porous low k spin-on dielectric material.

4. The method of claim 1, wherein said first low-k dielectric layer is porous.

5. The method of claim 1, wherein said first low-k dielectric layer has a thickness from about 600 Å to about 8000 Å.

6. The method of claim 1, wherein said low-k CMP protective layer is a spin-on low-k CMP protective layer having a thickness from about 50 Å to about 500 Å.

7. The method of claim 1, wherein said CMP protective layer is comprised of a spin-on material selected from the group consisting of: HOSP™, AP 6000™, HOSP BESt™, Ensemble™ Etch Stop, Ensemble™ Hard Mask, organo silsesquioxane, hydrido silsesquioxane, hydrido-organo silsesquioxane copolymer, siloxane and silsesquioxane.

8. The method of claim 1, further comprising:
forming a metal line in said first low-k dielectric layer.

9. The method of claim 1, further comprising:
forming a metal via in said first low-k dielectric layer.

10. The method of claim 1, further comprising:
adding additional dielectric layers; and
adding conductors to complete said electrical interconnect structure.

11. The method of claim 10, further comprising:
forming a stack of dielectric layers on said substrate, including at least said first low-k dielectric layer and said low k CMP protective layer; and
forming a plurality of patterned metal conductors within said dielectric layers.

12. The method of claim 11 further comprising:
curing said dielectric layers to promote crosslinking of said CMP protective layer to said first low k dielectric layer and to reduce CMP polish rate of said CMP protective layer.

13. The method of claim 12, wherein said first low-k dielectric and said CMP protective layers are cured in a single step.

14. The method of claim 13, wherein said first low-k dielectric and said CMP protective layers are cured in a furnace at a temperature from about 300° C. to about 500° C. within a period of time from about 15 minutes to about 3 hours.

15. The method of claim 12, wherein said dielectric layers in said stack are cured after sequential application in a single tool.

16. The method of claim 15, wherein said application tool is a spin coating tool containing high temperature hot plate baking chambers.

17. The method of claim 1, wherein said first low k dielectric layer is a spin-on first low k dielectric layer and said low k CMP protective layer is a spin-on low k CMP protective layer.

18. The method of claim 17, wherein said spin-on low k CMP protective layer has fine and evenly dispersed pores.

19. The method of claim 1, wherein said hardmask/CMP polish stop layer is a conventional CVD hardmask/CMP polish stop layer.

* * * * *